US008327091B2

(12) United States Patent
Huber et al.

(10) Patent No.: US 8,327,091 B2
(45) Date of Patent: Dec. 4, 2012

(54) COMBINED PARALLEL/SERIAL STATUS REGISTER READ

(75) Inventors: Brian Huber, Allen, TX (US); Frank Ross, Boise, ID (US); David R. Brown, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 81 days.

(21) Appl. No.: 12/880,336

(22) Filed: Sep. 13, 2010

(65) Prior Publication Data

US 2010/0332774 A1 Dec. 30, 2010

Related U.S. Application Data

(63) Continuation of application No. 11/847,575, filed on Aug. 30, 2007, now Pat. No. 7,809,901.

(51) Int. Cl.
*G06F 12/00* (2006.01)

(52) U.S. Cl. ............... 711/156; 711/109; 711/E12.001; 377/26

(58) Field of Classification Search ............... 377/75, 377/76; 711/109, 156
See application file for complete search history.

(56) References Cited

U.S. PATENT DOCUMENTS

| | | | |
|---|---|---|---|
| 4,476,560 A | 10/1984 | Miller et al. | |
| 4,937,781 A * | 6/1990 | Lee et al. | 711/149 |
| 5,099,481 A * | 3/1992 | Miller | 714/724 |
| 5,396,498 A | 3/1995 | Lestrat et al. | |
| 5,473,758 A | 12/1995 | Allen et al. | |
| 5,742,531 A * | 4/1998 | Freidin et al. | 708/232 |
| 6,456,542 B1 | 9/2002 | Roohparvar | |
| 6,499,070 B1 * | 12/2002 | Whetsel | 710/71 |
| 6,510,487 B1 | 1/2003 | Raza et al. | |
| 6,546,482 B1 | 4/2003 | Magro et al. | |
| 6,792,494 B2 * | 9/2004 | Bennett et al. | 710/302 |
| 7,010,643 B2 | 3/2006 | Roohparvar | |
| 7,809,901 B2 * | 10/2010 | Huber et al. | 711/156 |
| 2003/0088729 A1 | 5/2003 | Polizzi et al. | |
| 2005/0162934 A1 | 7/2005 | Roohparvar | |
| 2006/0123164 A1 * | 6/2006 | Rai et al. | 710/62 |
| 2006/0268642 A1 | 11/2006 | Chen et al. | |
| 2007/0047378 A1 | 3/2007 | Wolford et al. | |
| 2008/0205187 A1 * | 8/2008 | Pyeon | 365/230.08 |

OTHER PUBLICATIONS

Electronics Industries Alliance, JEDEC, Solid State Technology Association; "Proposed Optional Status Register for volatile LPDDR SDRAM"; Jul. 12, 2005.
JEDEC, Solid State Technology Association; "LPDDR Status Register Vendor ID"; Preliminary publication of JEDEC Semiconductor Memory Standard; Feb. 2006.

(Continued)

*Primary Examiner* — Charles Rones
*Assistant Examiner* — Nathan N Sadler
(74) *Attorney, Agent, or Firm* — Knobbe, Martens, Olson & Bear, LLP

(57) ABSTRACT

Methods and devices are disclosed, such as those involving a solid state memory device that includes a status register configured to be read with a combined parallel and serial read scheme. One such solid state memory includes a status register configured to store a plurality of bits indicative of status information of the memory. One such method of providing status information in the memory device includes providing the status information of a memory device in a parallel form. The method also includes providing the status information in a serial form after providing the status information in a parallel form in response to receiving at least one read command.

24 Claims, 6 Drawing Sheets

OTHER PUBLICATIONS

JEDEC, Solid State Technology Association; "LPDR Optional Status Register Read (SRR)"; Preliminary publication of JEDEC Semiconductor Memory Standard, Feb. 2006.

Stephen Brown and Zvonko Vranesic, Fundamentals of Digital Logic with VHDL Design. 2000. McGraw-Hill Higher Education. pp. 352-353.

* cited by examiner

COMBINED PARALLEL/SERIAL STATUS REGISTER READ

CROSS-REFERENCE TO RELATED APPLICATIONS

This application is a continuation of U.S. patent application Ser. No. 11/847,575, filed Aug. 30, 2007, issued as U.S. Pat. No. 7,809,901 on Oct. 5, 2010, the disclosure of which is hereby incorporated by reference in its entirety herein.

BACKGROUND OF THE INVENTION

1. Field of the Invention

Embodiments of the invention relate to solid state memories, and more particularly, in one or more embodiments, to status registers in solid state memories.

2. Description of the Related Art

Solid state memory devices have been widely used as data storage in various electronic devices. Generally, solid state memory devices include volatile memories (e.g., dynamic or static random access memories) and non-volatile memories (e.g., read-only memories and flash memories).

In most instances, solid state memory devices are manufactured in a form of an integrated circuit (IC) chip. Such memory devices are typically installed in electronic devices as components. Thus, various attempts have been made to set standards to address compatibility issues between memory devices and associated electronic devices. The Joint Electronic Device Engineering Council (JEDEC) has proposed various industry standards for solid state memory devices.

Certain memory devices include a status register that stores and provides memory status information to an associated electronic device during operation. The memory status information typically relates to operating conditions of the memory device. Examples of such operating conditions include temperature-related status information (e.g., quantized temperature measurements and temperature-dependent refresh timing information) and error-related status information (e.g., flags and other data indicating data error detection).

As part of standardization efforts, the JEDEC has proposed a specification (LPDR Optional Status Register Read (SRR); Committee Item Number 1663.01; Date of Council Approval: February 2006) for a status register in an SDRAM. According to the JEDEC specification, the status register is a 16-bit register. Status information stored in the status register is read by an associated electronic device in a parallel form via the data pins of the SDRAM.

BRIEF DESCRIPTION OF THE DRAWINGS

The embodiments will be better understood from the Detailed Description of Embodiments and from the appended drawings, which are meant to illustrate and not to limit the embodiments, and wherein.

DETAILED DESCRIPTION OF EMBODIMENTS

As described above, according to the JEDEC specification, status information stored in a status register of a memory device is read by an associated electronic device in a parallel form via the data pins of the memory device. This configuration requires the associated electronic device to be able to identify the data pins from one another, i.e., bit assignment because status information is output simultaneously in a parallel form through the data pins.

Certain electronic devices can be designed without a need to identify the data pins of a memory device for data read and write operations. As long as data can be written in and read out from the memory device, such electronic devices do not care which data pins are used for read and write operations, i.e., the bit assignment for data lines can be arbitrary. Such electronic devices, however, would still need additional logic or programming to identify the data pins of a memory device if the memory device is in compliance with the JEDEC specification.

To avoid needing such additional logic or programming, a memory device can be designed such that status information stored in a status register thereof is provided in a serial form. However, such a memory device may, by itself, be incompatible with electronic devices relying on compliance with the proposed JEDEC specification. Therefore, there is a need to provide a memory device with a status register read scheme that complies with the JEDEC specification and nevertheless does not require an associated electronic device to have data pin identification logic or programming for identification.

In one embodiment, a memory device is provided with a status register read (SRR) scheme in which status information is read in a parallel form and optionally in a serial form. Under this status register read scheme, status information stored in a status register is first read in a parallel form via the data pins of the memory device. Optionally, after the status information is read in a parallel form, each bit of the status information can be sequentially read (i.e., in a serial form) via at least one of the data pins of the memory device.

This configuration allows an associated electronic device not to have additional logic or programming to identify the data pins. The associated electronic device only needs to monitor the sequence of the bits output from the memory device to identify the status information. In addition, because the status information is first read in a parallel form, an electronic device relying on compliance with the JEDEC specification can obtain the status information of the memory device in the same manner as it would obtain status information from a JEDEC standard-based memory device.

Figure 1:
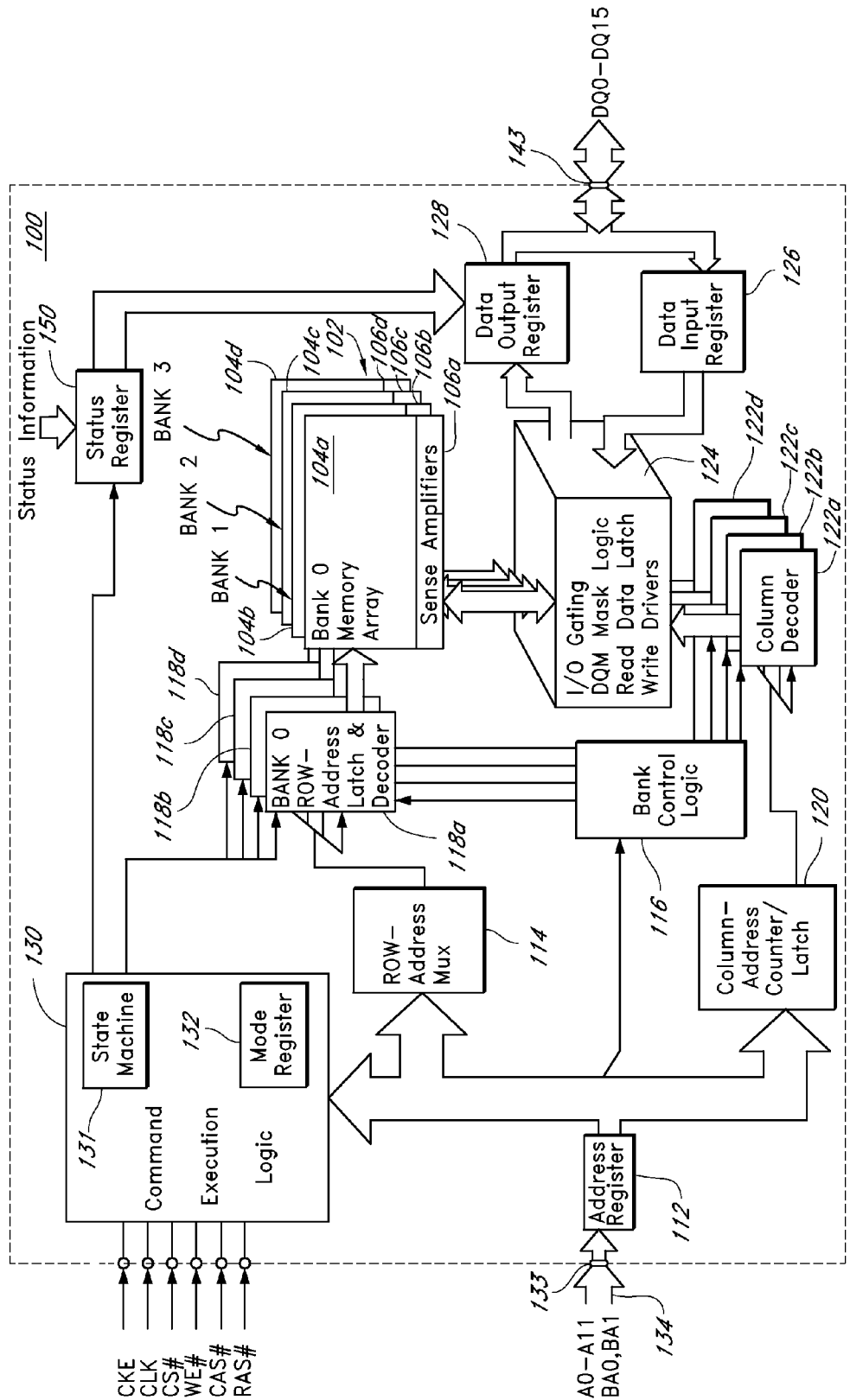
FIG. 1 is a block diagram of a memory device including a status register according to one embodiment.

FIG. 1 is a block diagram of a memory device 100 using a status register read scheme according to one embodiment. The illustrated memory device 100 is a dynamic random access memory. A skilled artisan will, however, appreciate that the principles and advantages described herein are applicable to other types of memory devices.

The memory device 100 includes a memory array 102 to store data. The memory array 102 includes a plurality of memory banks 104a-104d. Each of the memory banks 104a-104d includes an array of memory cells arranged in rows and columns. One particular embodiment of the memory device 100 will now be described, however, memory devices can vary with respect to architecture.

The memory device 100 also includes an address register 112, a row address multiplexer 114, a bank control logic circuit 116, and row address latch and decoder circuits 118a-118d. Each of the row address latch and decoder circuits 118a-118d is typically associated with a respective one of the memory banks 104a-104d. The memory device 100 also includes a column address counter/latch 120, column decoders 122a-122d, a command execution logic circuit 130, and an address input 133. Each of the column decoders 122a-122d is typically associated with a respective one of the memory banks 104a-104d. The memory device 100 further includes sense amplifiers 106a-106d, a column circuit 124, a data input register (or buffer) 126, and a data output register (or buffer) 128. Each of the sense amplifiers 106a-106d is typically associated with a respective one of the memory banks 104a-104d. The memory device 100 also includes a status register 150.

The address input 133 receives address signals A0-A11 and bank address signals BA0, BA1 from an associated electronic device through an address bus 134. The address register 112 may initially receive a row address and provide it to the row address multiplexer 114. The row address multiplexer 114 typically transmits the row address to a selected one of the row address latch and decoder circuits 118a-118d, according to the state of the bank address signals. The selected one row address latch and decoder circuit stores the row address and applies various signals to the associated memory bank, thereby accessing a selected row address.

The address register 112 also receives a column address through the address input 133, and provides it to the column address counter/latch 120. The column address counter/latch 120 provides the column address to one of the column decoders 122a-122d, depending on the state of the bank address signals. The one column decoder provides the column address to the column circuit 124. The column circuit 124 provides signals to the selected memory bank to access a selected memory cell in the memory bank. Data can be written in the selected memory cell through the data input register 126 via a data port 143. The data port 143 can include a plurality of pins DQ0-DQ15 to provide data in a parallel form. Alternatively, data can be read from a selected memory cell through the data output register 128 and the data port 143.

The command execution logic circuit 130 serves to control the operations of the memory device 100 upon receiving various signal, including a clock enable signal CKE, a clock signal CLK, a chip select signal CS#, a write enable signal WE#, a column address strobe signal CAS#, and a row address strobe signal RAS#. The command execution logic circuit 130 can include a state machine 131 and a mode register 132. The state machine 131 and the mode register 132 together serve to control states of operations performed on the memory array 102.

The status register 150 maintains status information relating to one or more operating conditions of the memory device 100. Examples of such operating conditions include temperature-related status information (e.g., quantized temperature measurements and temperature-dependent refresh timing information) and error-related status information (e.g., flags and other data indicating data error detection). The status information can also include the memory manufacturer's information and version (or revision) information.

In one embodiment, the status register 150 can store status information according to the proposed JEDEC specification. The illustrated status register is a 16-bit register having registers 0 to 15. The registers 0 to 3 are used to store manufacturer-specific device identification information. The registers 4 to 7 are used to store the manufacturer's revision identification information. The registers 8 to 10 are used to indicate a temperature-dependent refresh rate. The register 11 is used to indicate the width (e.g., 16 bits or 32 bits) of the memory device 100. The register 12 is used to indicate the type (e.g., LPDDR or LPDDR2) of the memory device 100. The registers 13-15 are used to indicate the density (e.g., 128, 256, 512, or 1024) of the memory device 100. The status register can also have registers reserved for future use. During a status register read state, the status register 150 provides the status information through the data output register 128 to the data port 143.

Figure 2:
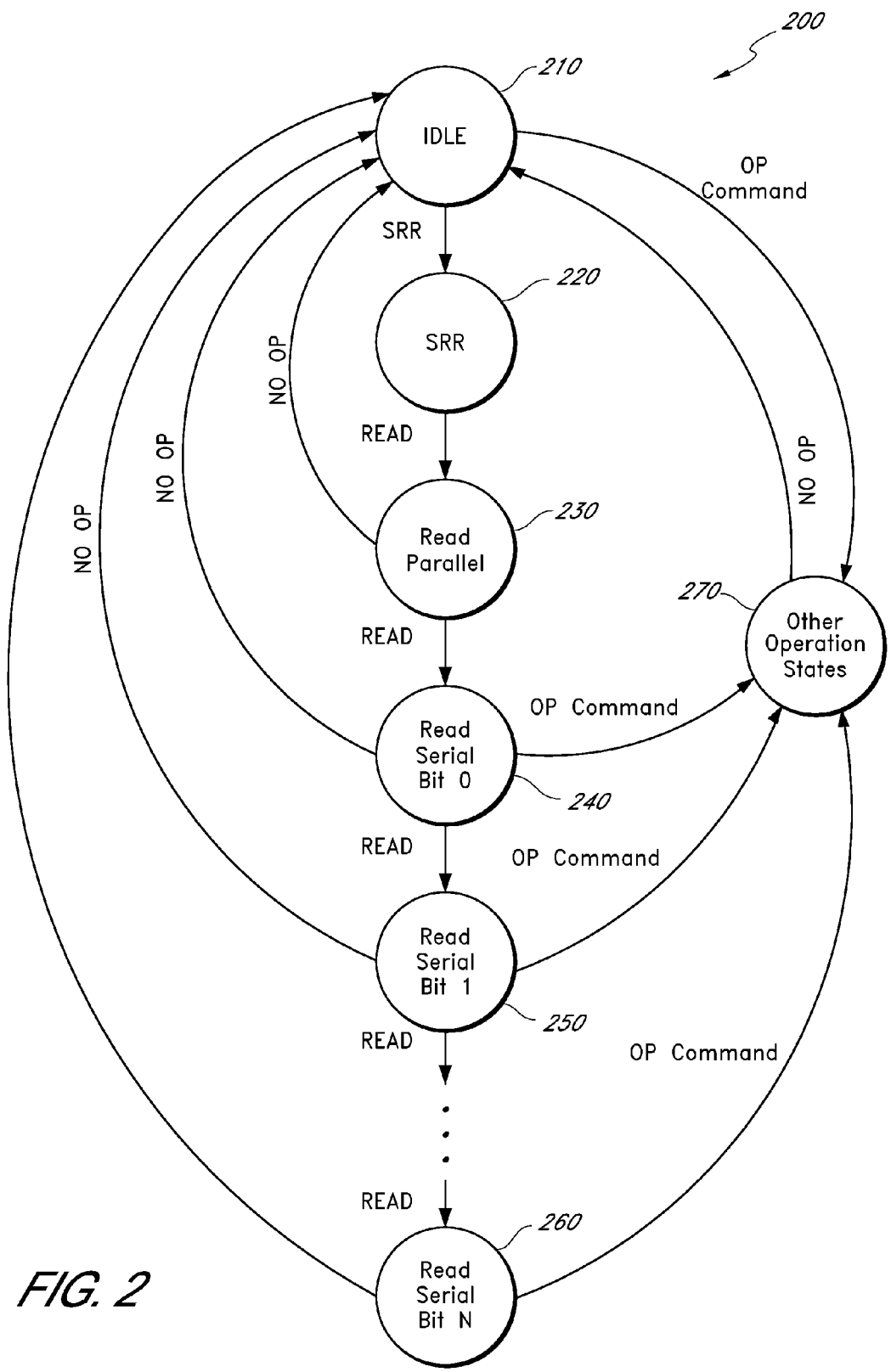
FIG. 2 is a state diagram illustrating a method of reading data from a status register of a memory device according to one embodiment.

FIG. 2 is a state diagram 200 illustrating a method of reading status information from a status register in a memory device according to one embodiment. In the illustrated embodiment, the method is described in the context of the memory device 100 of FIG. 1. A skilled artisan will, however, appreciate that the method can be adapted to other types of memory devices.

At state 210, the memory device 100 is in an IDLE state. If a status register read (SRR) command is issued from, for example, the command execution logic circuit 130 (FIG. 1) of the memory device 100, the state of the memory device 100 changes to a status register read (SRR) state 220. In this manner, the memory device 100 enters an SRR path formed by the SRR state 220 and subsequent read states 230-260. In the illustrated embodiment, the SRR command can be generated by the mode register 132 (FIG. 1).

If an operation command other than the SRR command is issued at the IDLE state 210, the state of the memory device 100 changes to one of other operation states 270 according to the operation command. A skilled artisan will appreciate that any suitable operation command can trigger a state change from the IDLE state 210 to one of other operation states 270. If there is no operation command for a certain period of time and a row is not active at one of the other operation states 270, the state of the memory device 100 returns to the IDLE state 210.

Upon receiving a READ command at the SRR state 220, the state of the memory device 100 changes to a Read Parallel (RP) state 230. In one embodiment, READ commands issued for the status register read operation described herein can be of the same type as that of a read command issued for a memory data read operation. In another embodiment, the READ commands can be of a type different from that of a read command issued for a memory data read operation. In the illustrated embodiment, the READ command can be issued by an associated electronic device. At the RP state 230, status information stored in the status register 150 (FIG. 1) is output in a parallel form via the data pins DQ0-DQ15 (FIG. 1).

If another READ command is issued to the memory device 100 at state 230, the state of the memory device 100 goes to a Read Serial Bit 0 (RSB 0) state 240. The other READ command can be the same type of command as the READ command issued to trigger a state change from the SRR state 220 to the RP state 230.

If, however, no READ command is issued for a certain waiting period of time at the RP state 230, the state of the memory device 100 goes back to the IDLE state 210. In one embodiment, the waiting period can be at least about two or three clock cycles. The waiting period can be selected at least partly based on the latency of the memory device output. For example, in an embodiment where latency 2 is employed for a non-DDR DRAM, the waiting period can be two clock cycles. In another embodiment where latency 3 is employed for a non-DDR DRAM, the waiting period can be three clock cycles. A skilled artisan will appreciate that the waiting period can vary widely depending on the memory device design. The term, "latency" refers to a time difference or delay between providing a read instruction to a memory device and the beginning of the actual data output from the memory device.

At the RSB 0 state 240, a first bit (bit 0) stored in the register 0 of the status register 150 is provided as an output via preferably all of the data pins DQ0-DQ15 of the memory device 100. When the serial data is provided on each data pin, the associated electronic device can read the serial data on any pin, thereby obviating the need to identify which pin should be monitored. In other embodiments, the first bit is provided via a portion, i.e., one or more of the data pins DQ0-DQ15. In such embodiments, the other data pins can be set to a default level, such as to 0 or 1.

If yet another READ command is issued to the memory device 100 at the RSB 0 state 240, the state of the memory device 100 changes to a Read Serial Bit 1 (RSB 1) state 250. Similar to the RP state 230, if, however, there is no operation command for a certain waiting period at the RSB 0 state 240, the state of the memory device 100 returns to the IDLE state 210.

If there is an operation command other than a READ command at the RSB 0 state 240, the state of the memory device 100 changes to the other operation state 270 as if the state of the memory device 100 was changing to the other operation state 270 from the IDLE state 210. In other words, an operation command which would trigger a state transition from the IDLE state 210 to the other operation state 270 can change the state of the memory device 100 from the RSB 0 state 240 to the other operation state 270. This configuration allows the RSB 0 state 240 to appear as the IDLE state (i.e., any valid operation command can be executed, leaving the SRR path). Thus, the memory device 100 does not have to return to the IDLE state 210 in order to execute an operation command. This configuration thus effectively meets the JEDEC specification.

At the RSB 1 state 250, a second bit (bit 1) stored in the register 1 of the status register 150 is provided as an output via one or more data pins DQ0-DQ15 of the memory device 100, e.g., all of the data pins. If another READ command is issued to the memory device 100, the state of the memory device 100 goes to a next Read Serial Bit state in which a third bit (bit 2) stored in the status register is output. Similar to the RP state 230, if there is no operation command for a certain waiting period at the RSB 1 state 250, the state of the memory device 100 returns to the IDLE state 210. If there is an operation command other than a READ command, the state of the memory device 100 changes to another state as if the state of the memory device 100 was changing to the other state from the IDLE state 210.

In this manner, the memory device 100 has N+1 number of Read Serial Bit states. N+1 is the total number of data bits that can be stored in the status register. N is 15 in the illustrated embodiment. At the last Read Serial Bit N (RSB N) state 260, the last bit stored in the last register of the status register 150 is output via all the data pins DQ0-DQ15 of the memory device 100. In other embodiments, the last bit can be output only from a portion of the data pins DQ0-DQ15. Then, the state of the memory device 100 returns to the IDLE state as a default. If, however, there is an operation command other than a READ command, the state of the memory device 100 changes to another state as if the state of the memory device 100 was changing to the other state from the IDLE state 210.

In the illustrated embodiment, a single bit is read at each Read Serial Bit state 240-260. In other embodiments, two or more bits can be sequentially read at one Read Serial Bit state. Such embodiments can have a reduced number of Read Serial Bit states compared to the embodiment described in connection with FIG. 2.

Figure 3:
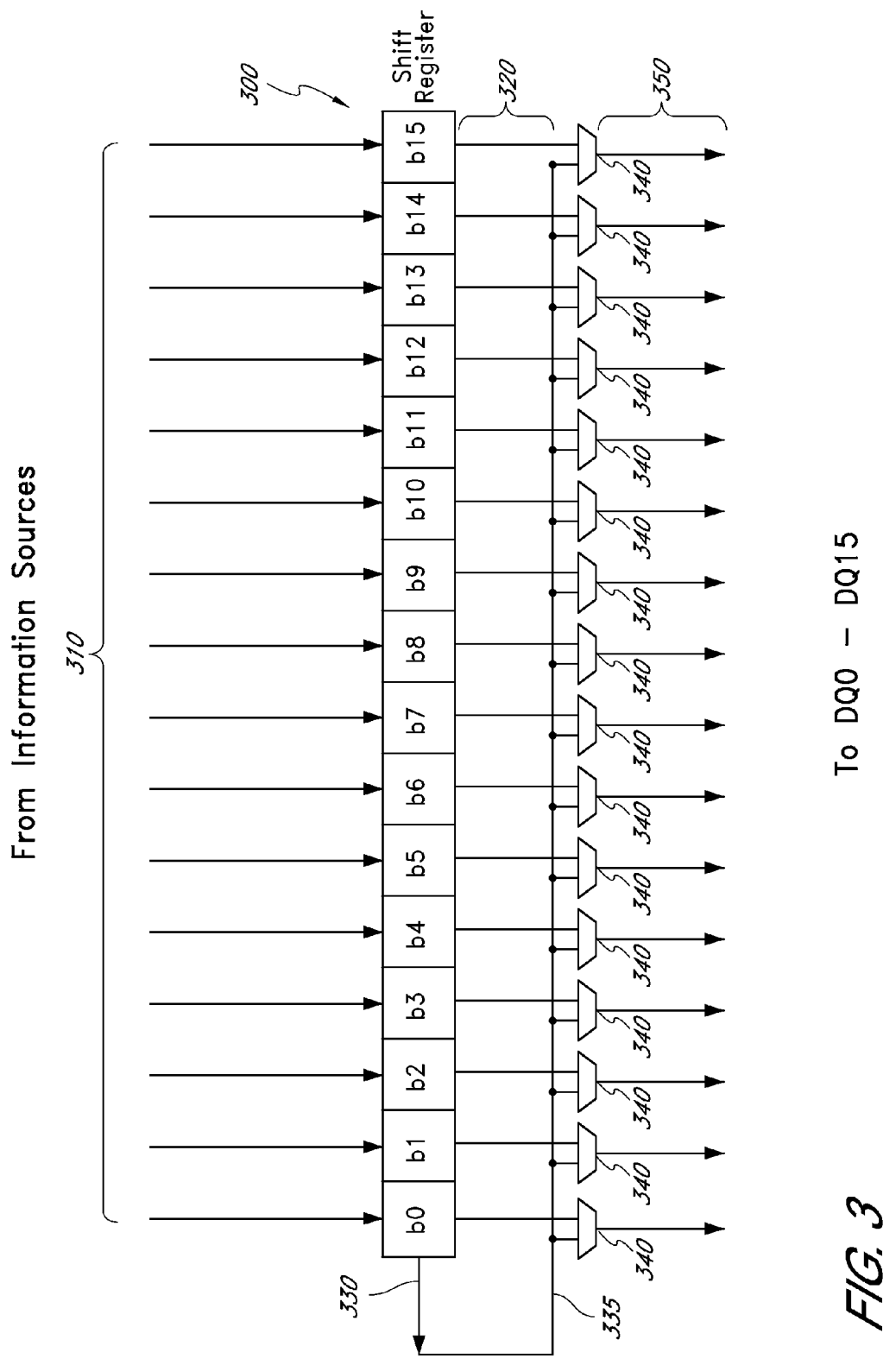
FIG. 3 is a block diagram of a status register of a memory device according to one embodiment.

FIG. 3 illustrates one embodiment of a status register 300 and interconnecting lines. In the illustrated embodiment, the status register 300 is a universal shift register configured to store 16-bit data, b0-b15. The status register 300 is configured to receive status information from information sources in a parallel form via input lines 310, as shown in FIG. 3.

The status register 300 is also configured to provide status information to data pins DQ0-DQ15. The illustrated status register 300 is coupled to parallel output lines 320 arranged in a parallel form. The illustrated status register 300 includes a serial output 330 for outputting a bit from the forward end of the status register 300 in a shifting direction. The serial output 330 is connected to a serial output line 335. The serial output line 335 and each of the parallel output lines 320 are multiplexed by a respective one of multiplexers 340. For example, the serial output line 335 and a parallel output line providing the first bit b0 are multiplexed by the leftmost multiplexer, as shown in FIG. 3. In this manner, the serial output line 335 and the other parallel output lines 320 are multiplexed by the other multiplexers 340. The multiplexers 340 are connected to multiplexer output lines 350 which provide output signals from the multiplexers 340 in a parallel form to the data pins DQ0-DQ15. The configurations of the status register 300, the multiplexers 340, the serial output line 335, and the multiplexer output lines 350 allow a bit from the forward end of the status register 300 to be provided to all of the data pins DQ0-DQ15. In other embodiments, the serial output line 335 can be configured to provide a bit from the status register 300 to at least one but less than all of the multiplexer output lines 350.

Figure 4A:
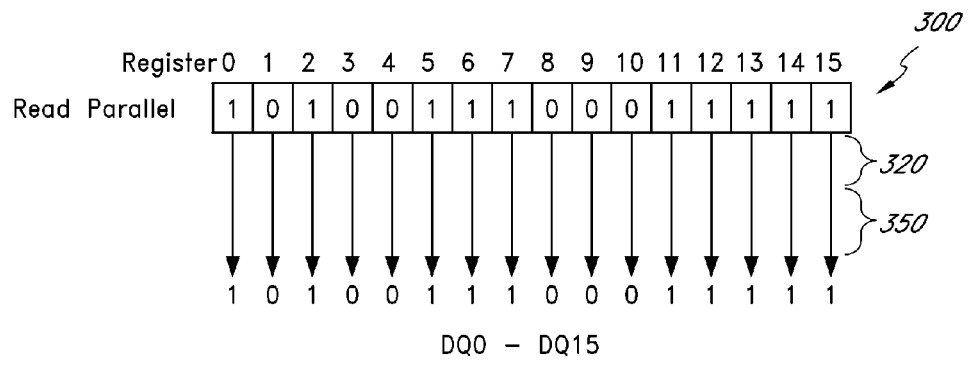
FIGS. 4A-4D are diagrams illustrating a method of reading a status register of a memory device according to one embodiment.

The multiplexers 340 are configured to output the status information simultaneously in a parallel form or one bit at a time to the data pins DQ0-DQ15, according to the status register read state. Referring to FIG. 4A, the status register 300 is configured to output the status information to the data pins DQ0-DQ15 in a parallel form via the parallel output lines 320 and the multiplexer output lines 350 at the Read Parallel state 230 (FIG. 2).

Figure 4B:
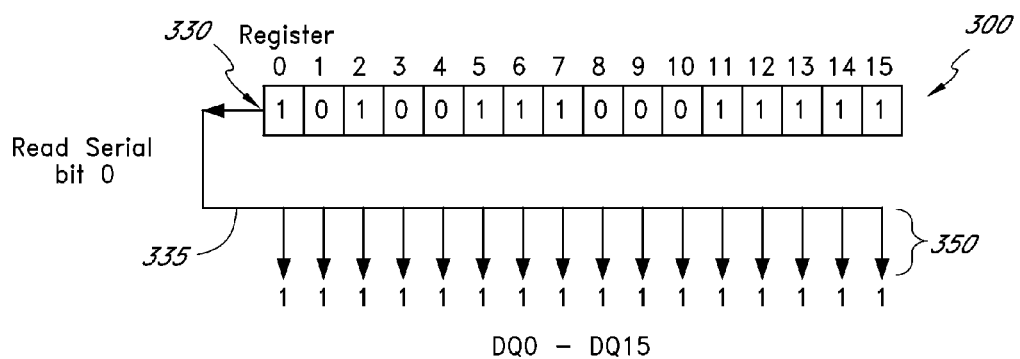

Upon receiving a READ command at the Read Parallel state 230, the state of the memory device 100 transitions to the Read Serial Bit 0 state 240. Referring to FIG. 4B, a first bit ("1"), which is stored at the first register (Register 0) of the status register 300 during the Read Parallel state 230, is output through the serial output 330. The first bit is transmitted to all the multiplexer output lines 350, and then to all the data pins DQ0-DQ15.

Figure 4C:
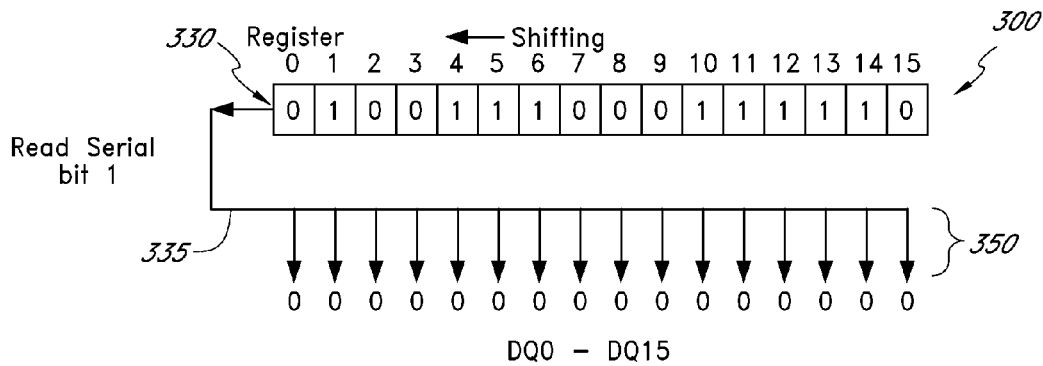

Upon receiving another READ command at the Read Serial Bit 0 state 240, the state of the memory device 100 changes to the Read Serial Bit 1 state 250. Referring to FIG. 4C, the status register 300 shifts bits stored therein in a shifting direction while a zero (0) or a one (1) is shifted into the rightmost register (Register 15) of the status register 300. In the illustrated embodiment, the bits are shifted from right to left. In other embodiments, the shifting direction can be from left to right. In such an embodiment, the serial output line 335 can be connected to the right end of the status register 300.

In one embodiment, the READ command which has triggered the state transition from the Read Parallel state 230 to the Read Serial Bit 0 state 240 may trigger the shifting operation such that the bits are shifted after the first bit is read out. In other embodiments, the bits in the status register 300 may be shifted at a selected interval upon receiving a command signal from the output buffer of the memory device such that the bits are shifted, regardless of receiving a READ signal. A skilled artisan will appreciate that the shifting operation can take place at any suitable time after the first bit is read and before another bit is read.

A bit ("0" in FIG. 4B) which was stored at the second register (Register 1) of the status register 300 during the Read Serial Bit 0 state has now been moved to the first register (Register 0) of the status register 300, as shown in FIG. 4C. The bit currently stored at the first register (Register 0) is output through the serial output 330. In one embodiment, the bit is transmitted to all the multiplexer output lines 350, and then to all the data pins DQ0-DQ15.

Figure 4D:
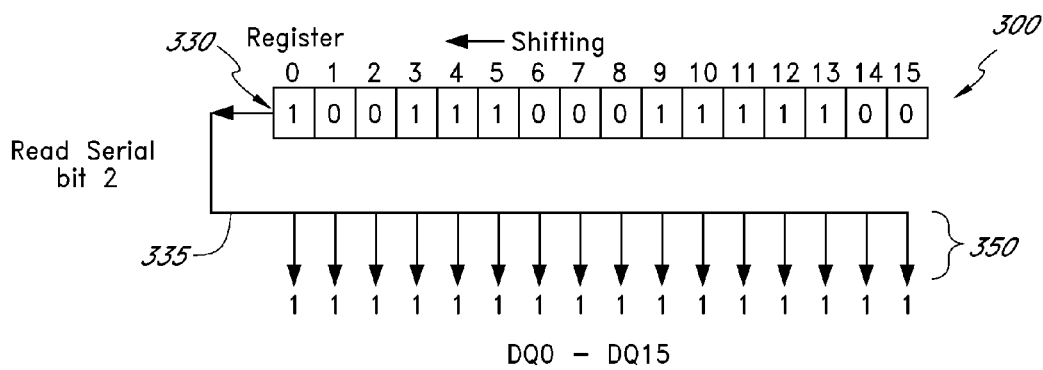

Similarly, upon receiving yet another READ command at the Read Serial Bit 1 state 250, the state of the memory device 100 changes to the Read Serial Bit 2 state. Referring to FIG. 4D, the status register 300 shifts bits stored therein in the shifting direction while a zero (0) or a one (1) is added to the rightmost register (Register 15) of the status register 300. A bit ("1" in FIG. 4C) which was stored at the second register (Register 1) of the status register 300 during the Read Serial Bit 1 state has now been moved to the first register (Register 0) of the status register 300, as shown in FIG. 4D. The bit currently stored at the first register (Register 0) is output through the serial output 330. The bit is transmitted to all the multiplexer output lines 350, and then to all the data pins DQ0-DQ15. In this manner, all the remaining bits in the status register 300 can be sequentially output via the serial output line 335 and the multiplexer output lines 350 to all the data pins DQ0-DQ15.

Figure 5:
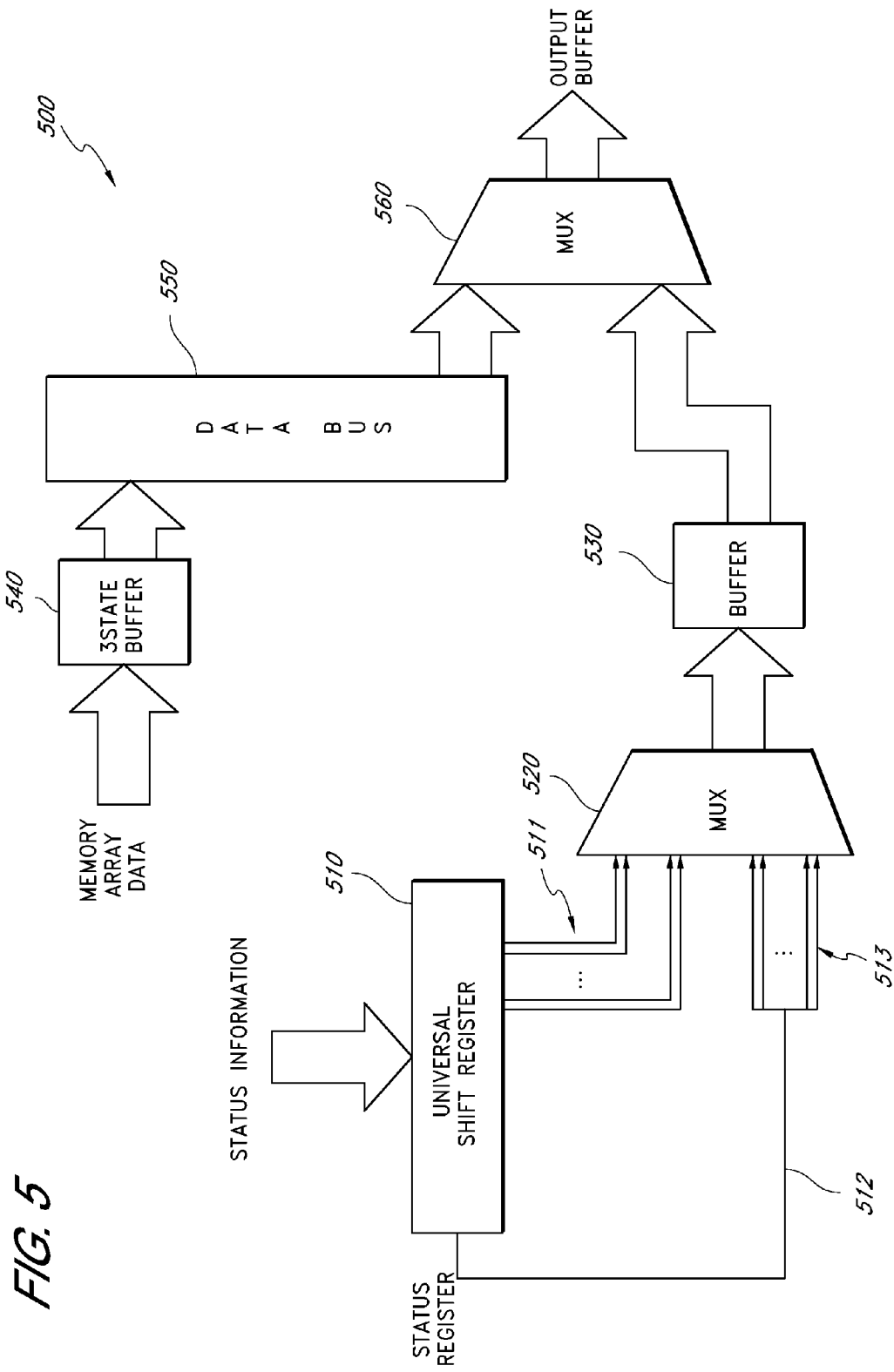
FIG. 5 is a block diagram of a memory device including a status register according to another embodiment.

FIG. 5 illustrates another embodiment of a memory device including a status register. The illustrated portion of the memory device 500 includes a status register 510, a first multiplexer 520, a first buffer 530, a second buffer 540, a data bus 550, and a second multiplexer 560. Other components of the memory device 500 are omitted for the sake of clarity.

The status register 510 is configured to receive and store the status information of the memory device. The illustrated status register 510 is a universal shift register which can output data in both parallel and serial forms. The status register 510 is connected to the first multiplexer 520 via parallel output lines 511. The status register 510 is also coupled to the first multiplexer 520 via a serial output line 512 and parallel lines 513. The serial output line 512 is connected to all the parallel lines 513 at a node. Thus, a serial signal from the status register 510 is fanned out to the parallel lines 513, and thus is provided in a parallel form to the first multiplexer 520.

The first multiplexer 520 is configured to receive status information, i.e., bits representing the status information, from the status register 510 via the parallel output lines 511 and via the serial output line 512 and the parallel lines 513. The first multiplexer 520 is a 2-to-1 multiplexer configured to selectively output either signals from the parallel output lines 511 or signals from the parallel lines 513, according to the status register read state (either Read Parallel state or Read Serial Bit state).

The first buffer 530 is configured to receive and store output signals from the first multiplexer 520. The first buffer 530 provides the stored output signals to the second multiplexer 560, according to the state of the memory device 500.

The second buffer 540 may be a tri-state (3 state) buffer configured to receive and store memory array data during data read operations. The second buffer 540 provides the stored memory array data via the data bus 550 to the second multiplexer 560, according to the state of the memory device 500.

The second multiplexer 560 is configured to selectively output to the output buffer of the memory device 500 the status information from the first buffer 530 or the memory array data from the second buffer 540, according to the state of the memory device 500.

In other embodiments, any suitable configurations of lines can be used for providing the bits stored in the status register 300 in a parallel form or in a serial form, according to the state of the status register read. A skilled artisan will appreciate that any suitable circuit can be used for providing the status register read scheme described above.

A memory device with a status register read scheme described above can be incorporated in various electronic devices. The electronic devices can be either a JEDEC-based device or a non-JEDEC device. A JEDEC-based device can include a module configured to identify the data pins of the memory device. On the other hand, a non-JEDEC device can include a module configured to identify a sequence of data output from the memory device.

Examples of the electronic devices can include, but are not limited to, consumer electronic products, electronic circuits, electronic circuit components, parts of the consumer electronic products, electronic test equipments, etc. Examples of the consumer electronic products include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, an optical camera, a digital camera, a washer, a dryer, a washer/dryer, a copier, a facsimile machine, a scanner, a multi functional peripheral device, a wrist watch, a clock, etc. Further, the electronic device can include unfinished products.

The memory device according to the embodiments described above has a status register read scheme that complies with the JEDEC specification while not requiring an associated electronic device to have data pin identification logic or programming. Thus, the memory device is compatible with a JEDEC-based electronic device. At the same time, the memory device permits status register read without having additional logic or programming to identify the data pins of the memory device.

One embodiment is a method of providing status information in a memory device. The method includes providing the status information of a memory device in a parallel form; and providing the status information in a serial form after providing the status information in a parallel form in response to receiving at least one read command.

Another embodiment is a method of operating a memory device. The method includes outputting status information in a parallel form from a memory device. The status information includes two or more digits. The method also includes outputting at least a portion of the same status information in a serial form.

Yet another embodiment is a memory device including one or more memory arrays; a plurality of data pins for data input/output (I/O) and reporting of status information for the one or more memory arrays; and a circuit configured to report the status information. The circuit is configured to provide the status information in a parallel form as outputs to the plurality of data pins in response to a command. The circuit is further configured to provide the status information in a serial form to at least one of the plurality of data pins at least partially in response to at least one command after the circuit provides the status information in a parallel form.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

We claim:

1. A method of providing status information from a memory device, the method comprising:
   receiving a status register read command;
   providing status information from a status register of the memory device to data pins of the memory device in a parallel form at least partially in response to the status register read command; and
   providing, at least partially in response to the same status register read command, the status information in a serial form to at least one of the data pins of the memory device to which the status information is provided in the parallel form.

2. The method of claim 1, wherein the status information comprises a plurality of digits, and wherein providing the status information in a parallel form comprises providing the plurality of digits simultaneously via the data pins.

3. The method of claim 2, wherein providing the status information in a serial form comprises providing the status information sequentially via at least one of the data pins.

4. The method of claim 1, wherein the status information comprises a plurality of digits, wherein providing the status information in a serial form comprises:
   receiving a first read command; and
   providing a first one of the plurality of digits.

5. The method of claim 4, wherein providing the status information in a serial form further comprises changing the state of the memory device to an idle state if there is no operation command for a period of time after providing the first digit.

6. The method of claim 5, wherein providing the status information in a serial form further comprises changing the state of the memory device to an operation state if there is a corresponding operation command within the period of time.

7. The method of claim 4 wherein the status register comprises a shift register, wherein the plurality of digits are stored in the shift register, wherein providing the status information in a serial form further comprises shifting the digits stored in the shift register in a direction so as to remove the first digit from the shift register after providing the first digit.

8. The method of claim 4, wherein providing the status information in a serial form further comprises repeating receiving a read command and providing one of the plurality of digits.

9. The method of claim 1, further comprising changing the state of the memory device to an idle state if there is no operation command for a period of time after providing the status information in a parallel form.

10. The method of claim 1, wherein providing the status information in the serial form comprises providing the status information to all of the data pins of the memory device to which the status information is provided in the parallel form.

11. A method of operating a memory device, the method comprising:
   outputting status information in a parallel form from a status register of the memory device at least partially in response to a first read command, the status information comprising two or more digits;
   detecting whether a second read command is received within a predetermined waiting period after receiving the first read command; and
   outputting at least a portion of the same status information in a serial form at least partially in response to detecting that the second read command is received within the predetermined waiting period after receiving the first read command, wherein the status register information is provided in the serial form to at least one data pin to which the same status information is provided in the parallel form.

12. The method of claim 11, wherein the status information comprises at least one of temperature-related status information and error-related status information.

13. The method of claim 11, wherein outputting the at least a portion of the status information comprises outputting one of the digits at a time.

14. The method of claim 11, wherein the predetermined waiting period is selected at least partly based on a latency of an output of the memory device.

15. The method of claim 11, wherein the predetermined waiting period is two or three clock cycles.

16. A memory device comprising:
   one or more memory arrays;
   a status register configured to store status information;
   a plurality of data pins for data input/output (I/O) and reporting of the status information for the one or more memory arrays; and
   a circuit configured to report the status information,
   wherein the circuit is configured to provide the status information in a parallel form as outputs to the plurality of data pins at least partially in response to a command, and
   wherein the circuit is further configured to provide, at least partially in response to the command, the status information in a serial form to at least one of the plurality of data pins to which the status information is provided in the parallel form.

17. The device of claim 16, wherein the status register comprises a universal shift register.

18. The device of claim 16, wherein the status information comprises a plurality of digits, wherein the circuit comprises:
   a plurality of parallel output lines configured to transmit the status information in a parallel form from the status register; and
   a serial output line configured to transmit one of the plurality of digits at a time from the status register.

19. The device of claim 18, wherein the circuit comprises at least one multiplexer configured to selectively provide the plurality of digits in a parallel form or one of the plurality of digits at a time to the plurality of data pins.

20. The device of claim 19, wherein the circuit comprises a plurality of multiplexers;
   wherein each of the multiplexers includes a first input, a second input, and an output;
   wherein the first input of each of the multiplexers is electrically coupled to the serial output line;
   wherein the second input of each of the multiplexers is electrically coupled to a respective one of the plurality of parallel output lines;
   wherein the output of each of the multiplexers is electrically coupled to a respective one of a plurality of data pins.

21. The device of claim 19, wherein the circuit further comprises a plurality of parallel lines electrically coupled to the serial output line, and a first multiplexer having inputs, wherein each of the inputs of the first multiplexer is electrically coupled to a respective one of the parallel lines and the parallel output lines.

22. The device of claim 21, wherein the circuit further comprises a first buffer configured to receive and store the status information from the first multiplexer.

23. The device of claim 22, further comprising a second buffer and a second multiplexer, wherein the second buffer is configured to receive memory array data and provide the memory array data to the second multiplexer, wherein the first buffer is further configured to provide the status information to the second multiplexer.

24. The memory device of claim 16, wherein the circuit is configured to provide the status information in the serial form to each of the plurality of data pins to which the status information is provided in the parallel form.

* * * * *